United States Patent [19]

Moussie

[11] 4,229,757
[45] Oct. 21, 1980

[54] PROGRAMMABLE MEMORY CELL HAVING SEMICONDUCTOR DIODES

[75] Inventor: Michel Moussie, Caen, France

[73] Assignee: U.S. Philips Corporation, New York, N.Y.

[21] Appl. No.: 938,470

[22] Filed: Aug. 31, 1978

[30] Foreign Application Priority Data

Sep. 30, 1977 [FR] France .................. 77 29476

[51] Int. Cl.² ............... H01L 27/10; G11C 17/06; H01L 29/04
[52] U.S. Cl. ............................ 357/59; 357/4; 357/45; 365/96; 365/105
[58] Field of Search .............. 357/45, 51, 59, 4, 68, 357/71; 307/238; 365/96, 103, 105

[56] References Cited

U.S. PATENT DOCUMENTS

| | | | |
|---|---|---|---|
| 3,377,513 | 4/1968 | Ashby | 357/51 |
| 3,634,929 | 1/1972 | Yoshida et al. | 357/45 |
| 3,641,516 | 2/1972 | Castrucci | 357/45 |
| 3,781,825 | 12/1973 | Buirker et al. | 357/45 |
| 4,145,702 | 3/1979 | Rau | 357/45 |
| 4,146,902 | 3/1979 | Tanimoto et al. | 357/23 |

*Primary Examiner*—William D. Larkins
*Attorney, Agent, or Firm*—Thomas A. Briody; Jack Oisher; James J. Cannon, Jr.

[57] ABSTRACT

Integrated electrically programmable read only memory cell having at least two back-to-back diodes.

A first diode is formed by a planar junction (7) between two superimposed regions (2, 6), the second diode is programmable and is formed by a lateral junction (11) between two coplanar zones (9, 10) of a thin semi-conductor layer isolated from the body by an insulating layer (8) having a contact aperture (18).

9 Claims, 6 Drawing Figures

PROGRAMMABLE MEMORY CELL HAVING SEMICONDUCTOR DIODES

BACKGROUND OF THE INVENTION

1. Field of the Invention

The present invention relates to an electrically programmable read only memory cell having an integrated circuit constituted by at least two semiconductor diodes to back-to-back arrangement.

2. Description of the Prior Art

Integrated semiconductor assemblies known as "read only memories" are known in the prior art having an XY matrix of line and column conductors, insulated from each other and at the intersections at which cells are connected each cell constituted by at least one semiconductor element, the impedance of the cell being capable of assuming two distinctly different values. Certain memories are programmable by the user, such that binary information can be inscribed from outside an envelope containing the memory, either by fusion of a fusible conductor, or by short-circuiting a junction, this modification of certain cells being selected according to a determined program.

Other devices are known comprising such cells and capable of being programmed, for example, decoding assemblies, logic devices for treating groups of information, often associated with memories. These devices will hereinafter also be designated by the generic term memories.

The cells may be constituted by arrangements of two diodes connected in series and in opposition. In this case the programming consists of short-circuiting one of the two diodes in the selected cells by destruction of the corresponding junction under a certain current density in the reverse direction, which density is determined by the surface area of the junction.

In the programmable memories known so far the diodes arranged back-to-back are diodes having a planar junction obtained by local diffusion of doping impurities in a surface region of a plane surface of a semiconductor slice. Attempts have been made to lower the value of the current level necessary for the destruction of the junction of the programmable diode, for the important voltage drops produced by a strong programming current are not compatible with the voltage levels admissible in the circuits, and for this purpose one tries to diminish the surface area of the junctions of the programmable diodes.

However, the techniques of localizing junctions impose minimum dimensions and it is not possible to reduce the area of the junction to be destroyed below a certain limit and thus the currents which are able to destroy the junction remain high. Currents of the order of 100 mA, for example, are necessary even when the breakdown voltage of the programmable diode is much lower than the breakdown voltage of the other diode, as is described in U.S. Pat. No. 3,641,516. The present technique of manufacturing integrated circuits does not permit reducing the areas of planar junctions and the current levels necessary for their destruction. Said currents remain too high whereas it should be possible to use currents of the order of 20 mA.

SUMMARY OF THE INVENTION

The invention has for its principal object to mitigate the above-mentioned disadvantages of known programmable read only memories and to provide for such memories a cell which necessitates only a particularly low current for the destruction of the junction of the programmable diode, taking into account the possibilities of manufacturing junctions having a minimum area.

According to the invention, an integrated electrically programmable read only memory cell having at least a first and a second diode arranged back-to-back is characterized in that the first diode is a planar p-n junction formed between two superimposed regions of which at least one region extends in an upper part of a semiconductor body and the second diode is a lateral p-n junction formed between two co-planar zones of a thin layer of semiconductor material extending locally on an insulating layer covering the body, a window in the said insulating layer ensuring a contact between the layer and the said body at the site of the first diode, and the area of the junction of the second diode being substantially smaller than that of the first.

It is to be noted that a junction is said to be lateral when it is limited to an area substantially normal to the plane of the layer of the semiconductor material where it is formed, the junction being said to be planar when it is parallel to said plane for its greater part.

The area of a lateral p-n junction formed between two co-planar zones of a thin layer may be much smaller than the minimum area of a planar junction between two superimposed regions such as they can be obtained by the known methods of manufacturing integrated circuits. The localization of planar junctions is achieved by inexpensive methods by means of masks masking for the diffusion of dopants or for the action of a chemical agent. The problems of alignment and definition of the masks as well as the effect of lateral diffusion or lateral reaction, impose limits to minimum dimensions. On the other hand, the methods of depositing or forming thin layers of semiconductor material permit of obtaining thicknesses which are much smaller than the minimum width of a doped region and hence sections which are much smaller than the minimum area of a planar junction.

At least one of the two dimensions of the lateral junction may thus be considerably reduced. The current necessary for triggering a short-circuit may be considerably reduced as well as the voltage necessary to cause the current to flow. Moreover, it is relatively easier and more precise to adjust the value of the area of a lateral junction by influencing the thickness of a deposited layer than to adjust the value of the area of a planar junction by influencing a width of the window of a mask.

Preferably, the area of the lateral junction of the programmable diode is smaller than one tenth of the area of the planar junction of the isolating diode, which permits of ensuring the programming without risk for the latter.

It is to be noted in addition that the memory cell according to the invention does not present the disadvantage of the parasitic transistor effect which often is a problem in devices comprising diodes having superimposed planar structures and has to be eliminated or compensated. Moreover, the residual resistance after short-circuit of the lateral junction of the programmable diode is negligible with regard to the series resistance which subsists in the first diode, termed isolating diode.

The integrated memories resulting from the technique of micro-electronics are usually manufactured from silicon. In a preferred form embodying the invention, the read only memory cell is constituted by a diode having a planar junction formed in a slice of monocrystalline silicon covered by a layer of silicon oxide and by a diode having a lateral junction formed in a layer of polycrystalline silicon deposited on the said layer of silicon oxide.

The deposition of thin layers of polycrystalline silicon of a determined thickness on a layer of an insulating material having apertures, if desired, to serve as contact windows is possible and already used in the manufacture of certain semiconductor devices. The known methods of masking, ion implantation and diffusion may be used to convert certain zones of the deposited polycrystalline silicon layer from one conductivity type into the other.

The characteristics of the deposited polycrystalline silicon obtained according to known methods permits obtaining the short-circuit of a p-n junction substantially in the same conditions as the short-circuit obtained in a p-n junction within a single crystal material, the doping concentrations being adjusted as a function of the searched optimum values of resistivity, mobility and concentration of free carriers.

Advantageously, the section of the lateral junction of the diode to be short-circuited, if desired, is reduced by making, in the configuration of the portion of the thin layer comprising the two zones, a narrowing at the location of the junction between the two zones.

In order to ameliorate the thermal isolation of the junction to be short-circuited and to protect also said junction from contamination by the atmosphere, a layer of a protecting insulating material is deposited on the slice supporting the cells of the memory and notably on and below the thin surface layer of semiconductor material constituting the two zones of the diode to be short-circuited. The layers of insulating material are advantageously made from silicon dioxide having a conductivity which is much lower than that of silicon and having good properties of protection and passivation of the junctions.

According to the preferred embodiment, the diode having a planar junction formed between two superimposed zones is obtained by a diffusion in a substrate made from a semiconductor material of a first conductivity type starting from a local area of the surface of said substrate, the diffused doping impurities giving the second conductivity type opposite to the first. The diffusion is obtained, for example, from a prediffusion deposit or from an implantation of ions of the doping impurity.

According to another embodiment, the planar junction diode formed between two superimposed regions is constituted by the junction obtained between one of the two zones of the lateral junction diode and an immediately underlying surface region of the substrate which is of the conductivity type opposite to that of said zone.

It will be obvious that instead of the planar junction diode destined to remain after programming and constituting the semiconductor element of each of the memory points which are not equivalent to an open circuit, it is possible to provide a transistor or any other more complex semiconductor element of which the p-n junction most directly connected to the programming diode is the planar junction provided according to the invention.

The invention may be applied in particular to networks of programmable read only memories such as read only memory arrangements having an XY matrix comprising line conductors and column conductors. The conductors may be of the same structure and of the same material as those of the known memory matrices, for example metallic conductors deposited in thin layers or conductors constituted by highly doped regions in the semiconductor body substrate or in a layer deposited on the semiconductor body. Each information bit is written in the memory by means of current pulses passed in the circuit selected through the intermediary of the line conductor and the corresponding column conductor.

In addition to the network of cells constituting the memory sites, the memory matrices often comprise an assembly of connected circuits, such as addressing circuits, decoding circuits, reading amplifiers, and so forth. Advantageously said circuits are manufactured according to known methods in the semiconductor body in which the planar diodes of the memory network are provided.

BRIEF DESCRIPTION OF THE DRAWINGS

The invention will now be described in greater detail with reference to the accompanying drawings, in which.

DESCRIPTION OF THE PREFERRED EMBODIMENTS

Figure 1:
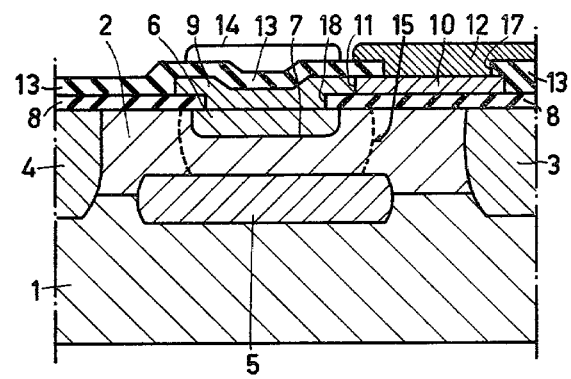
FIGS. 1, 2, 3 and 4 are sectional views of memory cells according to the invention in different forms, FIG. 1 corresponding to a section taken on the line AA of FIG. 5.

Referring now to the drawings, the preferred embodiment of this invention will first be described with reference to FIGS. 6 and 1.

Figure 6:
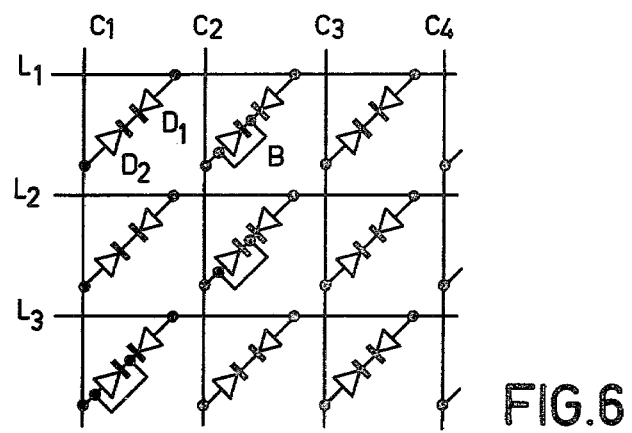
FIG. 6 is a partial diagram of a memory comprising cells formed from two diodes arranged back-to-back.

The memory shown in FIG. 6 has an XY matrix having plurality of line conductors $L_1$, $L_2$, and so forth, and a plurality of column conductors $C_1$, $C_2$, and so forth, insulated from each other. At each intersection of a line and a column an arrangement of two back-to-back diodes, such as $D_1$, $D_2$ is connected. Binary information, 0 or 1, is put in the memory at each point corresponding to the intersection of a line and a column by producing or not producing a short-circuit of one of the two diodes D; for example, the short-circuit B in the cell situated at the intersection of the line $L_1$ and the column $C_2$.

Each arrangement of two diodes constitutes a cell, one of the two diodes ($D_1$) is connected to a line conductor, the other ($D_2$) is connected to a column conductor. It is to be noted that the terms line and column say nothing at all about the orientation of the groups of cells considered nor about the number of cells they comprise.

Figure 5:
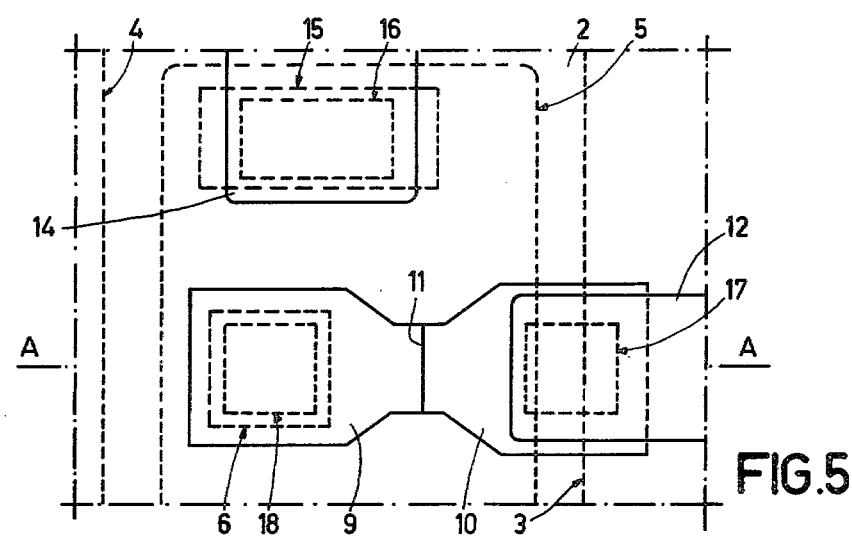
FIG. 5 is a partial plan view of a memory comprising cells as shown in FIG. 1.

The diagrammatic sectional view of FIG. 1, taken on the line AA of FIG. 5, is that of the arrangement of two back-to-back diodes constituting the cell between a conductor L and a conductor C in an XY memory matrix.

The cells shown are manufactured in a semiconductor body or substrate 1 of monocrystalline silicon, for example of the p-type, and having an epitaxial silicon layer 2 of the n-type covered by an insulating layer 8. The epitaxial layer 2 is divided in islands in the form of parallel bands isolated from each other by means of the isolation regions 3, 4 of the $p^+$-type which extend to the substrate and are diffused from the surface of the epitaxial layer. The longitudinal conduction of each band-shaped island of the epitaxial layer is ameliorated by means of a buried region 5 of the n+-type. Said n+-regions constitute the line conductors.

A diffused region 6 of the p-type forms with the layer 2 a p-n junction 7, called planar, the greater part of its surface being constituted by the substantially planar part of the diffusion front. The insulating layer 8 comprises at the area of the region 6 a window 18 contacting said region 6 with a zone 9 of a polycrystalline silicon layer deposited on the slice. The polycrystalline silicon layer comprises a second zone 10, the first and second zones 9, 10 together having a configuration which presents a narrow central part at the location of the junction 11 between the zone 9 which is of the p-conductivity type and the zone 10 which is of the n-conductivity type.

The surface of the slice including the surface of the polycrystalline silicon layer 9, 10 is covered with a layer 13 of an insulating and protecting material, for example silicon dioxide. The layer 13 has a window 17 contacting the zone 10 with a metallic conductor 12, for example of aluminium, in this case the column conductor to which the cell shown belongs.

The diode $D_1$ of the cell is formed by the junction 7 between the region 6 and the layer 2, and the diode $D_2$ of the cell is formed by the junction 11 between the zones 9 and 10 of the polycrystalline silicon layer. The junction area of the junction 11, which is dependent on the width of the configuration of the assembly of the two zones in its narrowest part and on the thickness of the polycrystalline silicon layer, is much smaller than a planar junction like junction 7 could be. The junction area of the planar junction depends on the surface area of the window of a diffusion mask (for the region 6 the mask may be constituted, for example, by the insulating layer 8). The current necessary to destroy the junction 11, to obtain the short-circuit, is much smaller than the current necessary to destroy a planar junction.

The planar junction diode $D_1$ is connected to a line conductor which is constituted in the case of the cell described by the highly doped buried region 5 which ensures the conduction between the various parts of the band-shaped island of the epitaxial layer 2 situated between the isolation zones 3 and 4. The voltage may be applied to the region 5 via a highly doped region 15 situated at the extremity of said band. The region 15 is in contact with a metallic conductor 14 via a window 16 made in the insulating layer 8 at an extremity of each line.

Figure 2:
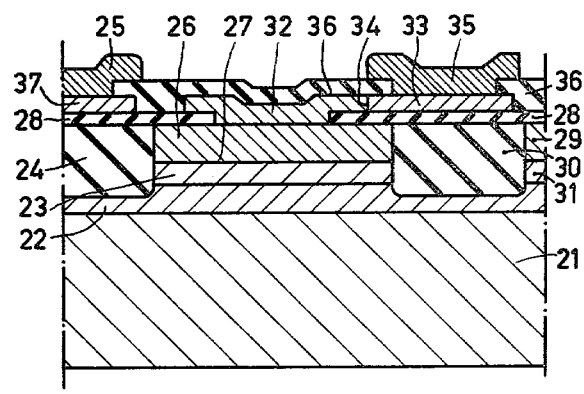

The cell shown in the diagrammatic sectional view of FIG. 2 is manufactured with a substrate 21 of the p-type on which are deposited superimposed successive epitaxial layers 23 of the n-type and 26 of the p-type. Said layers are obtained either directly by epitaxial deposition or by deposition followed by diffusion. The layers 26 and 23 are divided into regions isolated from each other by regions 24–30 of insulating material, advantageously of silicon oxide obtained by thermal oxidation of the epitaxial material. A buried region 22 in the form of a band (oriented in a direction parallel to the plane of the figure) interconnects the regions of the layer 23 situated on a same line. The junction 27 between the region of the layer 23 and the region of the layer 26 forms the planar junction diode of a cell of which the lateral junction diode to be short-circuited, if desired, is formed by the junction 34 between two zones of a thin layer of silicon deposited on an insulating oxide layer 28 which covers the slice: a zone 32 of the p-type and a zone 33 of the n-type.

The assembly is protected by an insulating layer 36 comprising windows for contacting the n-type zones of the lateral junction diodes of a same column by means of a metallic conductor 35 in the form of a band provided perpendicularly to the plane of the figure. In the sectional view of FIG. 2 are visible in addition the regions 29 and 31, parts of the layers 26 and 23, respectively, and forming the planar junction diode of an adjacent cell and a zone 37 of the n-type of another adjacent cell as well as a metallic conductor 25 in the form of a band parallel to the conductor 35 connecting the n-type zones of the lateral junction diodes of an adjacent column.

Figure 3:
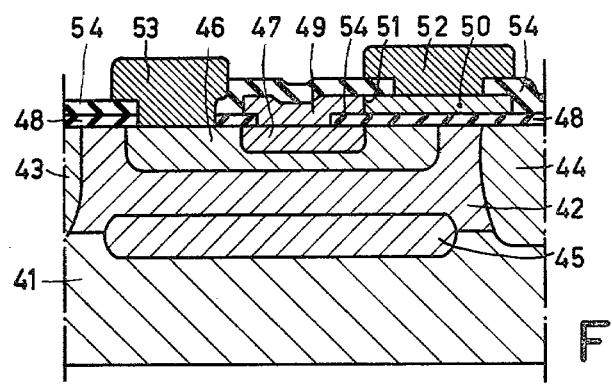

The cell shown in FIG. 3 is a modified embodiment in which the planar junction diode constitutes the emitter-base diode of a bipolar transistor. The cell is manufactured with a substrate 41 of monocrystalline silicon of the p-conductivity type covered by an epitaxial layer 42 of the n-type. The layer 42 is divided into parallel bands isolated from each other by means of diffused bands 43, 44 of the p+-type. A highly doped buried region 45 of the n+-type is destined to ameliorate the longitudinal conductivity of the band of the layer 42 and constitutes a sub-collector which is common to the various transistors of the same line.

A region 46 of the p-type constitutes the base of the transistor and a region 47 of the n+-type diffused in the region 46 constitutes the emitter of the transistor.

A metallic conductor 53 permits of contacting the base 46 via a window provided in an insulating layer 48 protecting the surface of the slice. Another window in the layer 48 ensures a contact between the emitter 47 and a zone 49 of the n-type, part of a thin silicon layer which with a zone 50 of the p-type of the same layer forms a lateral junction 51 having an area which is substantially smaller than the area the emitter-base junction of the transistor. A metallic conductor 52 permits of contacting the zone 50 via a window provided in an insulating layer 54 protecting the surface of the thin silicon layer.

Figure 4:
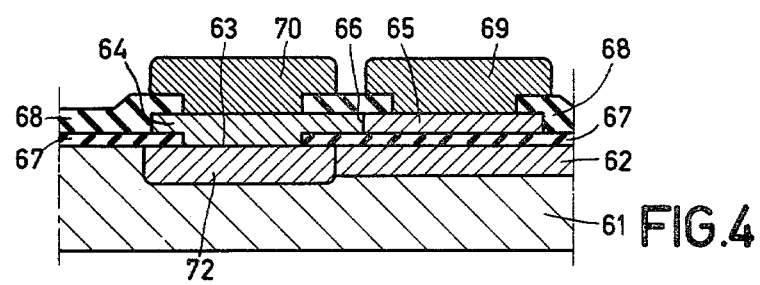

In another embodiment of a cell according to the invention, the planar junction diode is constituted by the junction between one of the two zones of the lateral junction diode and a surface region of the substrate. This embodiment is illustrated in the sectional view of FIG. 4. The cell is manufactured with a substrate 61 of n-type silicon in which a surface region 72 of the p-type and a highly doped region 62 of the p+-type are provided. The region 62 is destined to connect the region 72 electrically to a conductor and, if desired, to the similar regions of other cells. The surface of the substrate is covered by an insulating layer 67 which has a window above the region 72 and via which region 72 is in contact with a zone 64 of a thin layer of polycrystalline silicon deposited on the slice. The zone 64 is of the n-type and forms with the region 72 a p-n junction 63 of the planar type, while it forms, with the zone 65 of the same thin layer but of the p-type, another p-n junction 66 of the lateral type having an area which is substantially smaller than the area of the junction 63. The assembly is protected by an insulating layer 68. A conductor 69 is connected to the zone 65 and, if desired, a conductor 70 is connected to the zone 64 in the case in which such a contact is necessary.

The method of manufacturing a memory comprising cells according to the invention involves operations which belong to known techniques in the manufacture of semiconductor devices. For example, the manufacture of a memory comprising cells in accordance with the above description with reference to FIGS. 1 and 5 comprises at least the following operations. Starting from a slice of monocrystalline silicon of the p-conductivity type a local pre-diffusion deposit of antimony is made to realize the buried regions 5, then a deposition of silicon with a doping of arsenic is made to obtain the epitaxial layer 2 in a thickness of 1.5 to 2 μm.

The isolating regions 3, 4 are then formed by local diffusion of boron; the contact regions 15 are formed by local diffusion of phosphorus and finally the regions 6 of the diodes are formed by local implantation of boron ions down to a depth of 0.5 μm. All the preceding operations belong to techniques which are well known in the manufacture of semiconductor devices of the planar diffused type.

The slice is then covered by a layer 8 having insulating properties capable of ensuring the good quality of the deposition of polycrystalline silicon which is carried out afterwards. Said insulating layer 8 may be of silicon oxide but it is also possible to manufacture it from silicon nitride on a sub-layer of oxide. The layer 8 has a thickness of 1000 Å approximately. By means of a photoetching mask the windows 18 are opened in the insulating layer 8 by a chemical treatment by means of a suitable etchant. It is then possible to effect the deposition of polycrystalline silicon in which are formed the zones 9 and 10; this deposition is effected from silane SiH$_4$ and borane B$_2$H$_6$ in a reactor at a temperature between 600° and 700° C. The deposition is limited to a thickness of 2000 to 4000 Å and the ratio of borane is adjusted to obtain a doping of boron in a concentration of the order of $10^{17}$ atoms per cm$^3$.

The configuration or outline of the assembly of the regions 9 and 10 is then obtained by etching polycrystalline silicon by means of a photoetched mask of deposited silicon oxide. The polycrystalline silicon is attacked by means of a mixture of hydrofluoric and acetic acid. A new mask, preferably of silicon nitride, is used to localize the implantation of arsenic ions in the parts of the polycrystalline silicon layer constituting the zones 10. The implantation is dosed to obtain a concentration of arsenic of $5.10^{17}$ atoms/cm$^3$.

The device is completed by a deposition of insulating silicon oxide 13 in which the windows 17 are opened and by a deposition of aluminium followed by an etching the connection conductors, notably the conductors 12, are formed.

A memory manufactured with the above conditions may permit programming currents, ensuring the short-circuit by breakdown of the desired junctions, of the order of 20 mA if the junctions between the zones 9 and 10 for example have an area of the order of 1 μm$^2$. For example, the thickness of the polycrystalline silicon layer is 0.3 μm and the width of the zones is 3 μm at the location of the narrowing where the junction is present.

What is claimed is:

1. An integrated electrically programmable read only memory cell having at least a first and a second semiconductor diode in back-to-back arrangement, wherein the first diode is a planar p-n junction formed between two superimposed regions of which at least one region extends on the upper part of a semiconductor body and the second diode is a lateral p-n junction formed between two co-planar zones of a thin layer of a semiconductor material extending locally on an insulating layer covering the said body;

a window in the said insulating layer ensuring a contact between the said layer and the said body at the site of the first diode, and the area of the junction of the second diode being substantially smaller than that of the first.

2. A cell as claimed in claim 1, wherein said upper part of the body is a monocrystalline silicon and said thin layer is of polycrystalline silicon.

3. A cell as claimed in claims 1 or 2 wherein the section of the lateral junction between the two co-planar zones is smaller than one-tenth of the section of the planar junction between the two superimposed regions.

4. A cell as claimed in claims 1 or 2 wherein the outline of said thin layer presents a narrowing at the location of the junction between the two zones.

5. A cell as claimed in claims 1 or 2, wherein said zones of the thin layer are situated between two layers of insulating and passivating material, at least in the vicinity of the junction between said zones.

6. A cell as claimed in claims 1 or 2, wherein the region connected via the window in the insulating layer to one of the zones of the second diode is a planar region diffused in an upper layer of the body, said upper layer constituting the other region of said two superimposed regions of the first diode.

7. A cell as claimed in claims 1 or 2, wherein the region connected via a window in the insulating layer to one of the zones of the second diode is a portion of a first epitaxial layer covering a portion of a second epitaxial layer constituting the other region of the first diode.

8. A cell as claimed in claims 1 or 2, wherein the first diode is constituted by a junction formed between one of the two zones of the second lateral junction diode and an immediately underlying surface region of the substrate which surface region is of a conductivity type opposite to that of said one of the two zones of the second diode.

9. An integrated electrically programmable read only memory having a monocrystalline silicon body and having a plurality of cells as claimed in claim 1 or 2, in an XY-arrangement, wherein the lateral junction diodes of some but not all of the plurality of cells are electrically shorted.

* * * * *